United States Patent [19]
Matsuura

[11] Patent Number: 4,908,936
[45] Date of Patent: Mar. 20, 1990

[54] MANUFACTURING METHOD FOR A TUNER
[75] Inventor: Syuuji Matsuura, Ikoma, Japan
[73] Assignee: Sharp Kabushiki Kaisha, Osaka, Japan
[21] Appl. No.: 164,083
[22] Filed: Mar. 4, 1988
[30] Foreign Application Priority Data
  Mar. 6, 1987 [JP] Japan ................... 62-52729
[51] Int. Cl.⁴ .............................. H05K 3/34
[52] U.S. Cl. ........................ 29/837; 29/840; 29/843; 29/847
[58] Field of Search ............... 29/840, 837, 843, 847

[56] References Cited
U.S. PATENT DOCUMENTS
  4,360,144 11/1982 Cuddy et al. ............. 29/840 X
  4,761,881 8/1988 Bora et al. ............... 29/840

Primary Examiner—Timothy V. Eley
Attorney, Agent, or Firm—Birch, Stewart, Kolasch & Birch

[57] ABSTRACT

Disclosed is a manufacturing method for a tuner comprising the steps of temporarily fixing both chips and discrete parts by using an adhesive and soldering said chips and discrete parts on said substrate when solder-dipping said substrate and a chassis.

21 Claims, 2 Drawing Sheets

MANUFACTURING METHOD FOR A TUNER

BACKGROUND OF THE INVENTION

This invention relates to a manufacturing method of tuner constructed by incorporating a substrate on which parts are mounted into a chassis.

High frequency parts for a tuner are mostly built in a shielding case or a metallic case (called merely a chassis hereinafter). Television tuners for liquid crystal display have recently been required to become smaller in size and lower in cost, and it comes to be necessary to reconsider the conventional mass-production method.

A tuner is, in general, constructed by building a substrate mounting discrete parts such as high frequency parts and chips into a tuner chassis, but in this manufacturing method of the tuner, solder dipping is carried out independently in a process of mounting discrete parts and chips on the substrate and in a process of installing the substrate holding the discrete parts and chips into the tuner chassis.

In this way, the conventional manufacturing method needed a long work time because of two processes of solder dipping, and additionally lowered the reliability as a tuner because it was susceptible to thermal stresses.

SUMMARY OF THE INVENTION

Accordingly, it is hence a primary object of this invention to present a manufacturing method for a tuner capable of shortening the work process and improving the quality of the products. It is another object of this invention to solve the conventional problems by reducing the solder dipping processes from twice to once by temporarily fixing chips and discrete parts with adhesives.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above object, according to an embodiment of the present invention, a manufacturing method of a tuner comprises a step of temporarily fixing both chips and discrete parts by using adhesives and a step of soldering the chips and the discrete parts to a substrate at the same time when dipping the substrate and a chassis in solder. Therefore, the work time is thus shortened as is obvious from the above explanation because of the use of one solder dipping process and the quality of the products is improved by reducing thermal stress due to solder dipping.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE EMBODIMENTS

Figure 1:
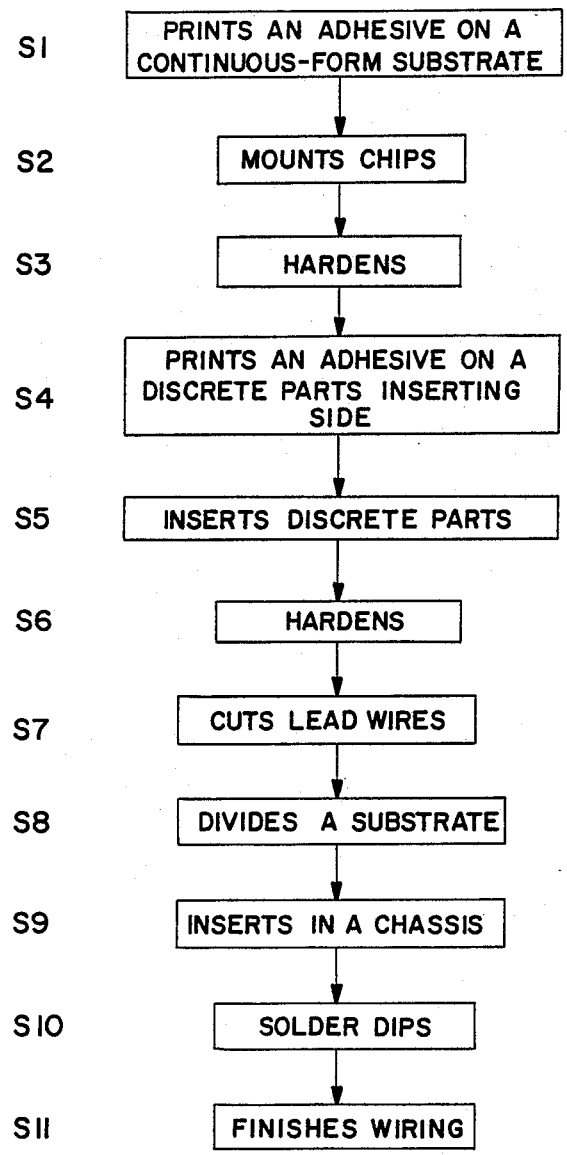
FIG. 1 is a process flow chart showing an embodiment of a manufacturing method of a tuner according to this invention.
Figure 2:
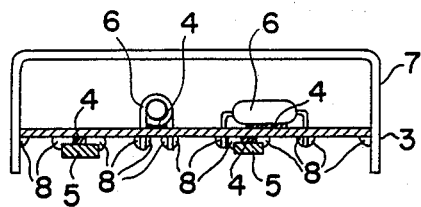
FIG. 2 is a sectional view showing wired state of a tuner produced by the manufacturing method shown in FIG. 1.

Referring now to FIG. 1 and FIG. 2, an embodiment of this invention is explained herein. FIG. 1 is a flow chart of the manufacturing process and FIG. 2 shows the state where wiring is finished.

In the manufacturing method for a tuner according to this invention, it is designed to temporarily fix chips and discrete parts preliminarily into a substrate with adhesive, and to solder the chips and the discrete parts to the substrate in a solder dipping process wherein the substrate is inserted and incorporated into a chassis, so that the dipping process is performed only once in the manufacturing process for the tuner.

In the drawings, small substrates 3 in a continuous-form substrate 2 are insulating substrates, and a circuit wiring pattern is formed by printing copper foil or the like on a surface of the substrates and removing the copper foil from unnecessary parts for a circuit wiring by etching. Lead wire mounting holes to mount discrete parts 6 having lead wire terminals are also mounted on the small substrates 3. The small substrates 3 are coated with solder resist to prevent solder adhesion on the part that the soldering is not required out of the circuit wiring because the solder dipping process is performed after mounting the chips and the discrete parts. A continuous-form substrate 2 may be composed of, for example, eight small substrates 3. The circuit wiring of each of the small substrates 3 includes, a terminal for the chips to which a terminal of a chip is connected and a terminal for discrete parts to which a lead wire terminal of a discrete part is connected.

Chips used in the present invention are circuit elements in chip state having no lead wire terminal such as capacitors, resistances, transistors, ICs and semiconductors. Other elements in chip shape having no lead wire terminal are acceptable. Discrete parts, therefore, mean electric circuit parts having lead wire terminals such as capacitor, resistances, ICs and semiconductors. Other parts having lead wire terminals may be accepted.

While referring to the flow chart shown in FIG. 1, the manufacturing method of the present invention is explained.

At first, a substrate 2 composed of a plurality of small substrates 3 for assembly is covered with a mesh screen having holes corresponding to the positions on which chips will be mounted, and an adhesive 4 is printed on the positions on which chips are to be mounted (step 1). The adhesive 4 used here is a thermosetting adhesive, which is composed of, for example, epoxy resin or the like.

After the printing process of the adhesive 4 (step 1), chips 5 are mounted on the parts printed with the adhesive 4 on the continuous-form substrate 2, that is, the small substrates 3 by a chip mounting device and arranged so as to confront with terminals for chips on the small substrates 3 respectively (step 2). Then, by putting this continuous-form substrate 2 in an electric oven, the adhesive 4 on the substrates 3 on which the chips 5 are mounted is hardened to temporarily fix the chips 5 on the substrates 3 (step 3).

Sequentially, in the same way as in the printing process of the adhesive 4 (step 1), the adhesive 4 is printed on the positions of mounting discrete parts by covering the substrate 2 having a plurality of small substrates 3 for assembly with mesh screen possessing holes at the points corresponding to the positions of mounting discrete parts (step 4).

Here, the side on which the discrete parts 6 are mounted is on the opposite side of mounting the chips.

The discrete parts 6 are consequently inserted from the opposite side of the chip mounting side by means of an insert machine or the like. That is, lead wires of the discrete parts 6 are inserted in the lead wire mounting holes opened in the small substrates 3 and the discrete parts 6 are arranged at the positions where the adhesive 4 is applied (step 5).

After inserting the discrete parts b, by putting the parts into the electric oven again, the adhesive 4 on the substrate 3 on which discrete parts 6 are mounted is hardened, and thus the discrete parts 6 are temporarily fixed on the substrates 3 (step 6).

When the discrete parts 6 are temporarily fixed, extra portions of the lead wires of the discrete parts 6 are uniformly cut off by a cutter (step 7).

Figure 3:
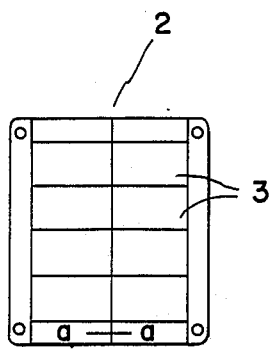
FIG. 3 is a plan showing the shape of a continuous-form substrate.
Figure 4:
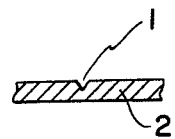
FIG. 4 is a magnified sectional view on line a—a in FIG. 3.

Next, the continuous-form substrate 2 is divided into plural small substrates 3 by a divider (step 8). The shape of the continuous-form substrate 2 is shown in FIG. 3, which is designed to be divided into small substrates 3 by a V-shape cut (snap) 1 shown in a magnified view in FIG. 4.

The divided small substrate 3 is incorporated in a chassis 7 (step 9).

The chassis 7 holding the small substrate 3 is soldered 8 by solder dipping method to be connected with the small substrate 3. And in the solder dipping of the small substrate 3 and the chassis 7, the chips 5 and the discrete parts 6 are soldered 8 to the substrate 3 at the same time (step 10).

This ends the wiring of a tuner (step 11).

By the soldering in step 10, terminals of the chips 5 and the discrete parts 6 are firmly connected with corresponding terminals in the circuit wiring pattern on the substrate 3 respectively, and the substrate 3 is securely fixed in the chassis 7.

In this course, a check process to check the wiring status may be added after dividing the continuous-form substrate 2 into small substrates 3 before incorporating them into the chassis 7.

The cutting process of the lead wires can be omitted if the lead wires of the discrete parts 6 are preliminarily set at the minimum required length. The setting of the lead wire length is relatively easy in comparison with the case of directly performing solder dipping without the temporary fixing with the adhesive because the lead wires are merely fixed temporarily with the adhesive 4.

In this invention, as the chips are temporarily fixed on the surface having the circuit wiring pattern on the substrate 3, and the discrete parts are temporarily fixed on the other surface not having any circuit wiring pattern on the substrate 3, application of the adhesive 4 in step 4 may be carried out without using the mesh screen.

As described above, in the present invention, since the chips and the discrete parts are temporarily fixed by the adhesive on both sides of the substrate respectively, and the soldering between the substrate and the chassis, and between the substrate and the chips or the discrete parts is carried out after combining the substrate with the chassis, the dipping for soldering is required only once.

In addition, since a plurarily of small substrates on which the chips and the discrete parts are temporarily fixed can be formed at a time, the work process can be shortened and, therefore, tuners can be mass-produced.

The solder dipping process, which was conventionally performed a plurality of times, can be reduced to only once. As a result, a lot of effects can be obtained from the reduction of the work process. A significant effect can be found especially in the shortening of the work process and the improvement of the product quality.

The following benefits, among others, can also be obtained in this embodiment.

(1) Adhesive application work in the tuner adjusting process can be omitted.

(2) Defective soldering, solder bridge, and other solder defects can be prevented.

(3) Tuner thickness can be reduced because looseness of the discrete parts is eliminated.

(4) Cost can be lowered.

(5) Defects due to howling or shock noise in the tuner finishing process can be reduced.

As described above, this invention can be present a useful manufacturing method of tuner in which solder dipping process is simplified.

While only certain embodiments of the present invention have been described, it will be apparent to those skilled in the art that various changes and modifications may be made therein without departing from the spirit and scope of the present invention as claimed.

What is claimed is:

1. A manufacturing method for a tuner comprising the steps of:
    applying an adhesive at desired positions on a substrate;
    mounting and temporarily fixing chips and discrete parts on the substrate at the positions where the adhesive is applied;
    incorporating the substrate containing the chips and discrete parts, temporarily affixed thereto, into a chassis of a tuner; and
    soldering said substrate with the chassis, the chips and the discrete parts.

2. The manufacturing method according to claim 1, wherein said discrete parts include lead wire terminals and said lead wire terminals are inserted into holes in the substrate.

3. The manufacturing method according to claim 1, and further including the steps of printing copper foil on the substrate and removing by etching the copper foil from predetermined portions of the substrate to form a wiring circuit pattern.

4. The manufacturing method according to claim 1, wherein the chips do not include lead wiring terminals.

5. The manufacturing method according to claim 1, wherein the adhesive is a thermosetting adhesive.

6. The manufacturing method according to claim 1, wherein the adhesive is an epoxy resin.

7. A manufacturing method for a tuner comprising the steps of:
    applying a first adhesive at desired positions on a first side of a first substrate on which a circuit wiring pattern is printed;

mounting and temporarily fixing chips on the first substrate at the positions where said first adhesive is applied;

applying a second adhesive at desired positions on a second side of said first substrate;

mounting and temporarily fixing discrete parts on the substrate at the positions where said second adhesive is applied;

incorporating the first substrate on which the chips and the discrete parts are temporarily fixed into a chassis of a tuner; and soldering said first substrate with the chassis, the chips and the discrete parts.

8. The manufacturing method according to claim 7, wherein the discrete parts include lead wire terminals.

9. The manufacturing method according to claim 7, wherein said discrete parts include lead wire terminals and said lead wire terminals are inserted into holes in the substrate.

10. The manufacturing method according to claim 7, wherein the chips do not include lead wiring terminals.

11. The manufacturing method according to claim 7, wherein the discrete parts include lead wire terminals.

12. The manufacturing method according to claim 7, wherein the circuit wiring pattern is formed by the steps of printing copper foil on the substrate and removing by etching the copper foil from predetermined portions of the substrate to form the wiring circuit pattern.

13. The manufacturing method according to claim 7, wherein the adhesive is a thermosetting adhesive.

14. The manufacturing method according to claim 7, wherein the adhesive is an epoxy resin.

15. A manufacturing method for a tuner comprising the steps of:

supplying a second substrate integrally including a plurality of first substrates having a circuit wiring pattern printed on a first side of said first substrates;

applying a first adhesive at desired positions on the first side of said first substrates;

mounting and temporarily fixing chips on the first substrates at the desired positions where said first adhesive is applied;

applying a second adhesive at desired positions on a second side of said first substrates;

mounting and temporarily fixing discrete parts on the first substrates at the positions where said second adhesive is applied;

dividing said second substrate into the plurality of first substrates;

incorporating the first substrates on which the chips and the discrete parts are temporarily mounted into the chassis of a tuner; and soldering said first substrates with the chassis, the chips and the discrete parts.

16. The manufacturing method according to claim 15, wherein said discrete parts include lead wire terminals and said lead wire terminals are inserted into holes in the substrate.

17. The manufacturing method according to claim 15, wherein the circuit wiring pattern is formed by the steps of printing copper foil on the substrate and removing by etching the copper foil from predetermined portions of the substrate to form the wiring circuit pattern.

18. The manufacturing method according to claim 15, wherein the chips do not include lead wiring terminals.

19. The manufacturing method according to claim 15, wherein the discrete parts include lead wire terminals.

20. The manufacturing method according to claim 15, wherein the adhesive is a thermosetting adhesive.

21. The manufacturing method according to claim 15, wherein the adhesive is an epoxy resin.

* * * * *